United States Patent [19]

Foley et al.

[11] Patent Number: 4,860,824

[45] Date of Patent: Aug. 29, 1989

[54] HEAT EXCHANGE ELEMENT

[75] Inventors: John M. Foley, Grafton; Ronald L. Piuze, Shrewsbury; Ralph I. Larson, Jr., Bolton; George Doumani, North Andover, all of Mass.

[73] Assignee: Digital Equipment Corporation, Maynard, Mass.

[21] Appl. No.: 263,600

[22] Filed: Oct. 27, 1988

Related U.S. Application Data

[62] Division of Ser. No. 37,046, Apr. 10, 1987.

[51] Int. Cl.$^4$ .......................... F28D 15/00; F28F 7/00
[52] U.S. Cl. ....................... 165/165; 165/79; 165/905
[58] Field of Search ................ 165/165, 79, 104.34, 165/905

[56] References Cited

U.S. PATENT DOCUMENTS 4,041,591  8/1977  Noll et al. ............................ 165/165
4,126,178  11/1978  Kelm ..................................... 165/165

FOREIGN PATENT DOCUMENTS 2408462  8/1975  Fed. Rep. of Germany ...... 165/165
1212756  10/1959  France ............................ 165/104.33

Primary Examiner—Albert W. Davis, Jr.
Attorney, Agent, or Firm—Hayes, Soloway, Hennessey & Hage

[57] ABSTRACT

A heat exchange element having a heat receiving side and a heat dissipating side and having a serpentine member defining a first plurality of parallel elongate grooves, having elongate openings all in the heat receiving side, and a second plurality of parallel elongate grooves, having elongate openings all in the heat dissipating side, the grooves of the first plurality being interdigitated with the grooves of the second plurality, and closures which close all of the open ends of one of the pluralities of grooves. An enclosure for an electronic assembly having a rack in which electronic assemblies may be mounted in a vertical orientation, the rack being mounted in a cavity defined by side walls, a rear wall, a front wall, a top and a base which together separate the cavity from the environment surrounding the enclosure. At least one of the walls having one of the heat exchange elements sandwiched between an outer panel and an inner panel.

9 Claims, 4 Drawing Sheets

HEAT EXCHANGE ELEMENT

This is a divisional of co-pending application Ser. No. 037,046 filed on Apr. 10, 1987, pending.

BACKGROUND OF THE INVENTION

The present invention relates to a novel heat exchange element and to an enclosure, for electronic assemblies, incorporating one or more of the heat exchange elements as structural wall portions.

In the past, environmentally sealed passively cooled enclosures typically utilized extruded heat sinks attached to the inside and outside of the enclosure walls with the utilization of gasketting to seal the enclosure. Such constructions have routinely been used in high cost military devices and have the disadvantage of that high cost and of being unduly heavy.

It is an object of the present invention to provide a lightweight, low-cost heat exchange element preferably having a relatively high surface area to volume ratio by comparison with prior art heat exchangers.

It is a further object of the present invention to provide an enclosure for electronic assemblies incorporating one or more of said heat exchange elements as structural wall portions, preferably arranged for counterflow heat exchange using forced convection inside the enclosure and natural convection outside of the enclosure.

SUMMARY OF THE INVENTION

According to the invention there is provided a heat exchange element having a heat receiving side and a heat dissipating side and comprising a serpentine member defining a first plurality of parallel elongate grooves, having elongate openings all in the heat receiving side, and a second plurality of parallel elongate grooves, having elongate openings all in the heat dissipating side, the grooves of the first plurality being interdigitated with the grooves of the second plurality, the groove ends all terminating in open ends and closure means closing all of the open ends of only one of the first and second plurality of grooves.

Also according to the invention there is provided an enclosure for heat generating assembly comprising:

a rack in which heat generating assemblies may be mounted, the rack being mounted in a cavity defined by side walls, a rear wall, a front wall, a top and a base which together separate the cavity from the surrounding environment of the enclosure;

at least one of said walls having a heat exchange element sandwiched between an outer panel and an inner panel and being rigidly attached thereto;

said heat exchange element having a heat receiving side facing said cavity and a heat dissipating side facing the surrounding environment and comprising a serpentine member defining a first plurality of parallel elongate grooves, having elongate openings all in the heat receiving side, and a second plurality of parallel elongage grooves, having elongate openings all in the plurality being interdigitated with the grooves of the second plurality, the groove ends all terminating in open ends, and closure means closing all of the open ends of only the first plurality of grooves; and a blower means for circulating air past a said assembly, when in the rack, to cool said assembly and subsequently through the heat receiving grooves of the heat exchange element past the inner panel for recirculation past the assembly.

BRIEF DESCRIPTION OF THE DRAWINGS

The invention will now be described in detail, by way of example, with reference to the accompanying drawings in which.

DESCRIPTION OF PREFERRED EMBODIMENTS

Figure 1:
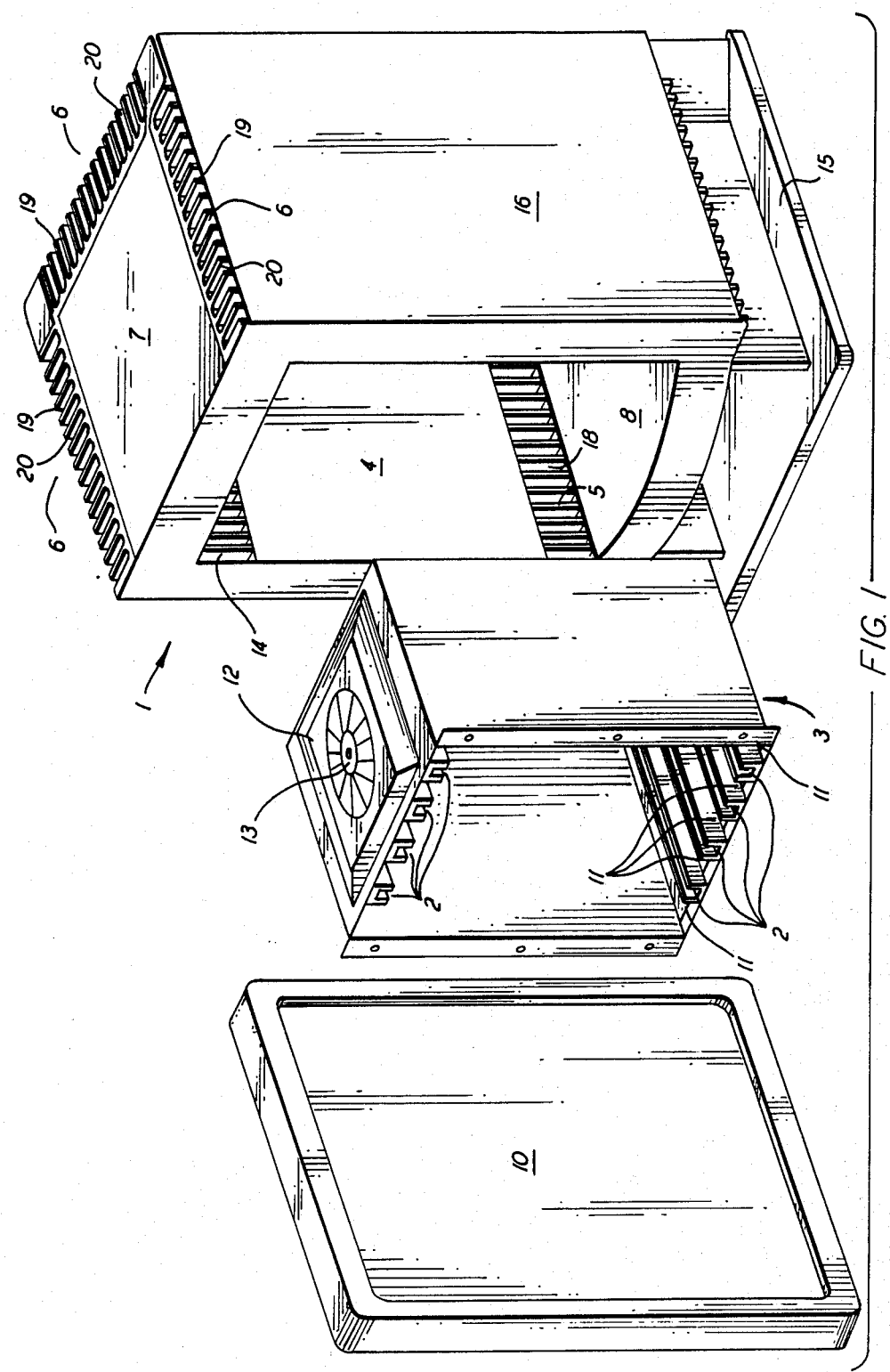
FIG. 1 is a partially disassembled perspective view of a first embodiment of enclosure according to the present invention.
Figure 2:
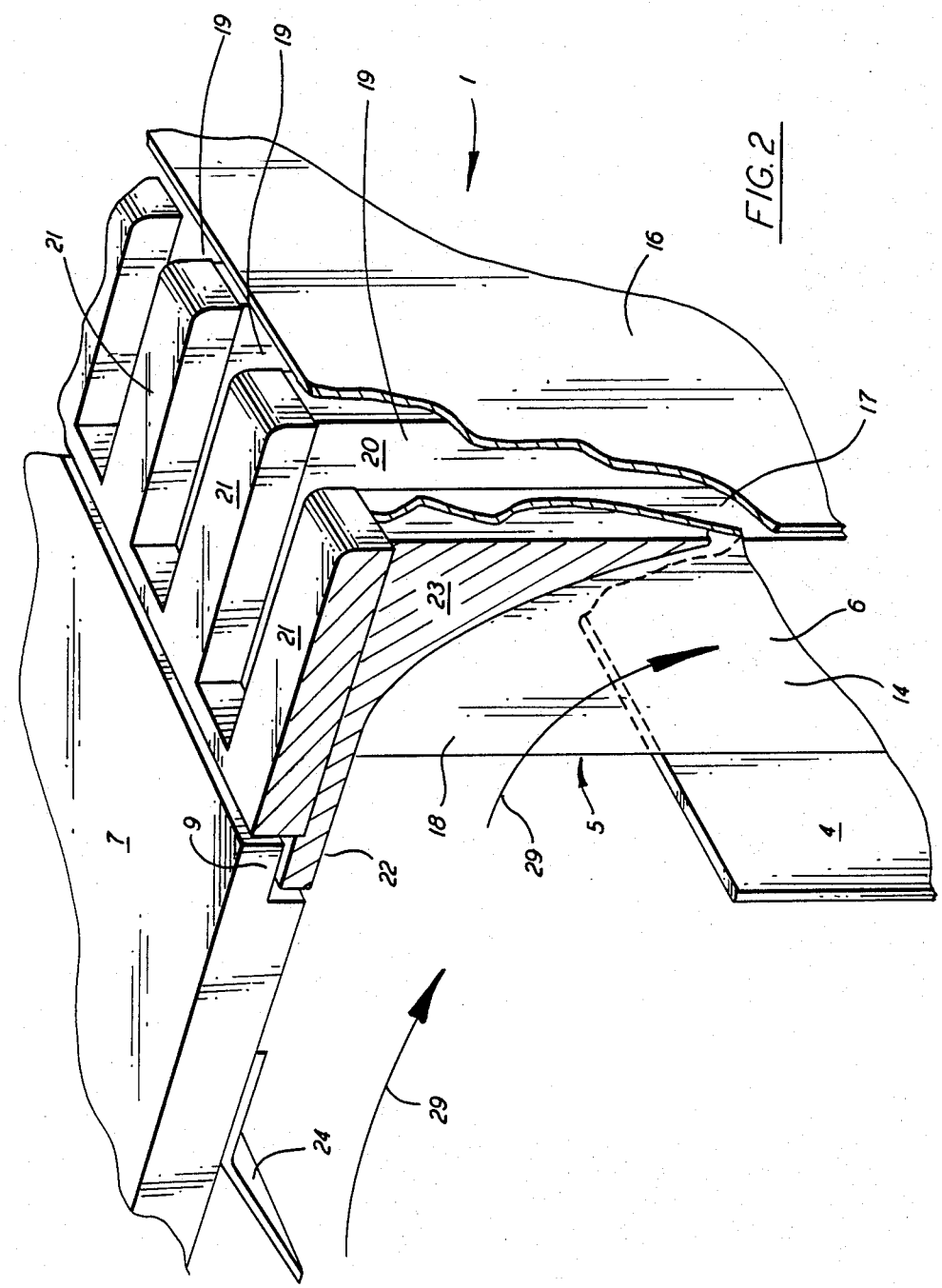
FIG. 2 is a fragmentary partially sectioned perspective view of a portion of one end of a heat exchange element in the enclosure of the first embodiment.

With reference first to FIGS. 1 and 2 there is shown an enclosure 1 for housing electronic assemblies (for example, printed circuit boards carrying electronic components) vertically disposed in mounting rails forming part of an assembly support rack 3. The rack, in the assembled enclosure, is mounted with its side walls 4 of sheet metal and rear wall (not shown) also of sheet metal adjacent inner panels 4 (one only being shown) which are bonded to the inner surfaces 5 of three heat exchange elements 6. The heat exchange elements 6 in combination with the inner panels 4 and outer panels 16 form the side and rear walls of the enclosure 1. The enclosure is completed by a top panel 7 and a base panel 8 which are rigidly attached to the walls of the enclosure in a sealed manner, preferably by adhesive utilizing an overlapping joint 9. The environmentally sealed enclosure is completed by a front panel 10 which is removably mounted in sealed manner to form the front wall of the enclosure 1.

The bottom of the rack 3 defines openings to permit circulation of air from under the rack upwardly past the electronic assemblies when mounted in the rails. The top of the rack 3 defines similar openings to permit air flow to a blower enclosure 12 which incorporates a blower 13 to draw air upwardly through the interior of the rack 3 from a space which is provided between the bottom of the rack and the base panel 8 to a space provided between the blower enclosure 12 and the top panel 7 and to force that air downwardly past the inner heat exchange surfaces 14 of heat exchange element 6 back to the space between the bottom of the rack 3 and the base panel 8 for recirculation through the rack.

The blower enclosure 12 includes a closure panel which fills the horizontal cross-section of the enclosure 1, adjacent the top of the inner panels 4, when mounted therein to ensure that the desired air circulation patterns are achieved. The blower enclosure and its closure panel are not part of rack 3.

Completing the enclosure is a base 15 of plastic. The outer panels 16 are metal and are bonded to the outer surfaces 17 of their associated heat exchange elements 6.

The three heat exchange elements 6 while described here as three separate elements may in fact be integrally formed as a single unit and then folded at the corners of the enclosure to provide the three elements shown.

Each heat exchange element has a serpentine transverse cross-section thereby to define a plurality of parallel inner grooves 18 alternating and interdigitated with parallel outer grooves 19. The inner grooves 18 define the inner heat exchange surfaces 14 while the outer grooves define outer heat exchange surfaces 20.

The heat exchange elements are constructed of aluminum 0.020 inches thick and the depth to average width ratio of both the inner and outer grooves is in excess of approximately 3:1 (preferably approximately 8:1). The grooves 18 and 19 extend vertically for the entire height of the walls of the enclosure from the base panel 8 to the top panel 7 with the ends of the outer grooves 19 open to permit natural convection for removal of heat from the heat exchange element to the surrounding environment. The outer side panels 16 and the rear panel provide a chimney effect to enhance natural convection through the outer grooves 19 and also to provide additional radiating surface.

The ends of the inner grooves 18 are closed by plastic caps 21 to which the caps adhere as they cure in situ at the ends of the inner grooves during the molding process. The caps 21 are integral with and joined by an elongate portion 22 forming one part of the overlapping joint 9. The caps 21 are also integral with concavely curved air directors 23 which extend into each of the inner grooves to minimize impedence as air is forced from the space above the rack 3 generally horizontally into the inner grooves 18, above the inner panels 4, as it is redirected to a downward direction. The curved air directors at lower ends of the inner grooves minimize impedence to air flow as the air arriving downwardly through the inner grooves is redirected to a horizontal direction below the inner panels 4 into the space under the rack 3.

Adjacent the center of the panel 7 above the outlet of the blower enclosure 12, inside of the enclosure, are deflector plates 24 (one only being shown) which deflect air leaving the blower enclosure 12 as it moves vertically upwardly to a horizontal direction toward the inner grooves 18 of the three elements 6.

It will be appreciated that the cross-section of the inner and outer grooves may differ and that these cross-sections are dimensioned in accordance with standard heat exchanger technology to appropriately relate the inner heat exchange surfaces and the outer heat exchange surfaces with effective transfer of heat from the air circulated inside the enclosure through the heat exchange element by forced circulation to the dissipation of that heat from the outer groove by natural convection. Such design will, of course, take into account the amount of heat to be dissipated, the rate of forced air circulation within the enclosure, the permitted temperature differentials and maximum limit of temperatures, etc.

Figure 3:
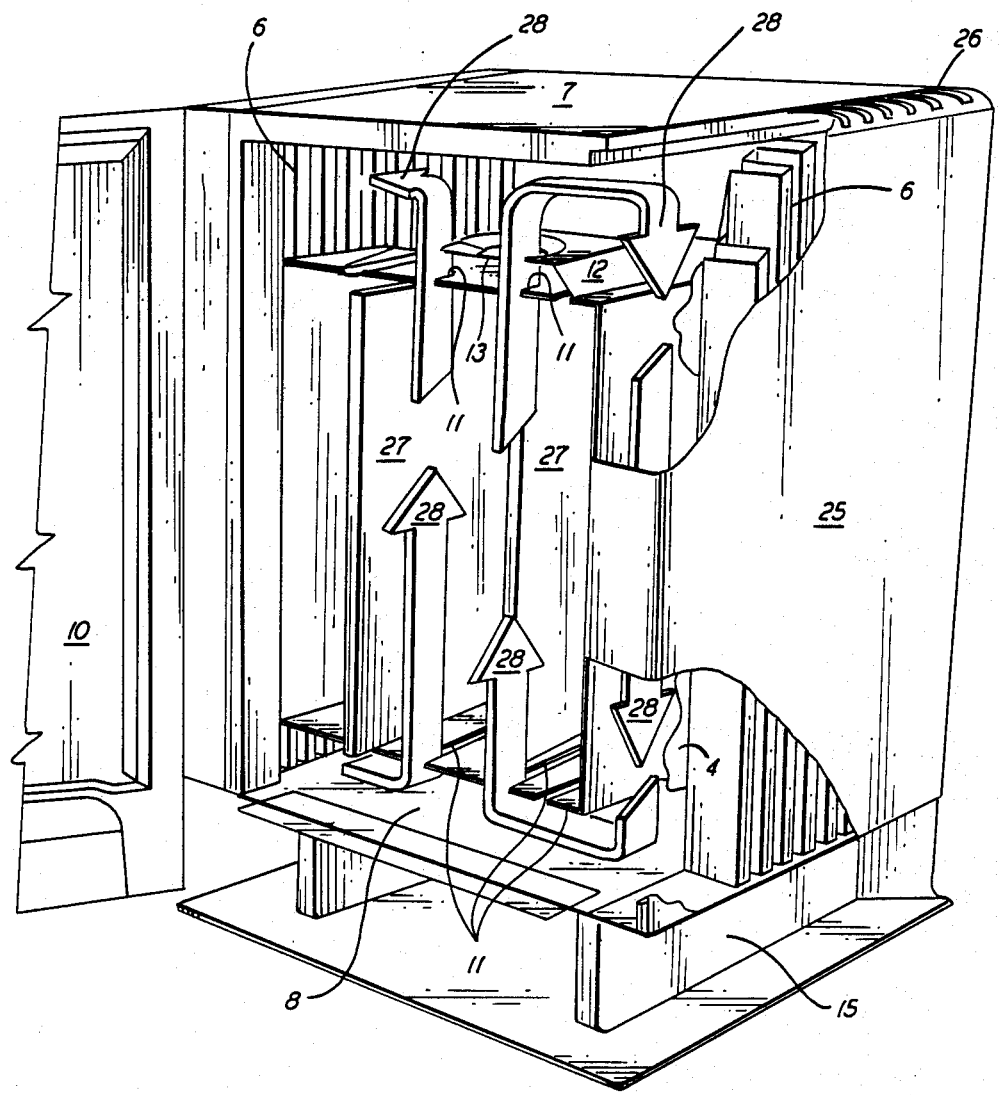
FIG. 3 is a partially sectioned perspective view of a second embodiment of enclosure according to the present invention.

With reference now to FIG. 3, the second embodiment of the invention will be described. Where appropriate, reference numerals corresponding to those used in the description of FIGS. 1 and 2 are utilized. The enclosure of this embodiment differs from the first embodiment substantially only in the design of the side panels 25 and rear panel (not shown) which are wrapped over the top and bottom of the heat exchange elements 6. At the upper and lower ends of these side panels are vent openings 26 (the upper ones only being shown) to facilitate natural convection through the outer grooves of the heat exchange element. In this second embodiment two electronic assemblies 27 are shown mounted in the rack 3. The circulation of air by the blower 13 is shown, for diagrammatic purposes only, by arrows 28. It will be appreciated that the air flow also passes rearwardly through the rear heat exchange element.

It will be appreciated that while the first and second embodiments have been described as utilizing three heat exchange elements, it may well be appropriate depending on the amount of heat to be dissipated from the enclosed to utilize one, two or three elements and that it may even be appropriate to use a fourth heat exchange element forming a structural part of the front panel 10.

It will also be appreciated that the heat exchange elements form an integral part of the wall structure of the enclosure and contribute significant strength to that structure.

Figure 4:
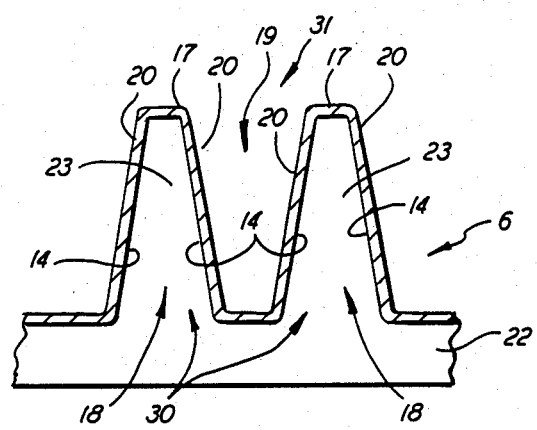
FIG. 4 is a fragmentary cross-section of a heat exchange element according to the invention.
Figure 5:
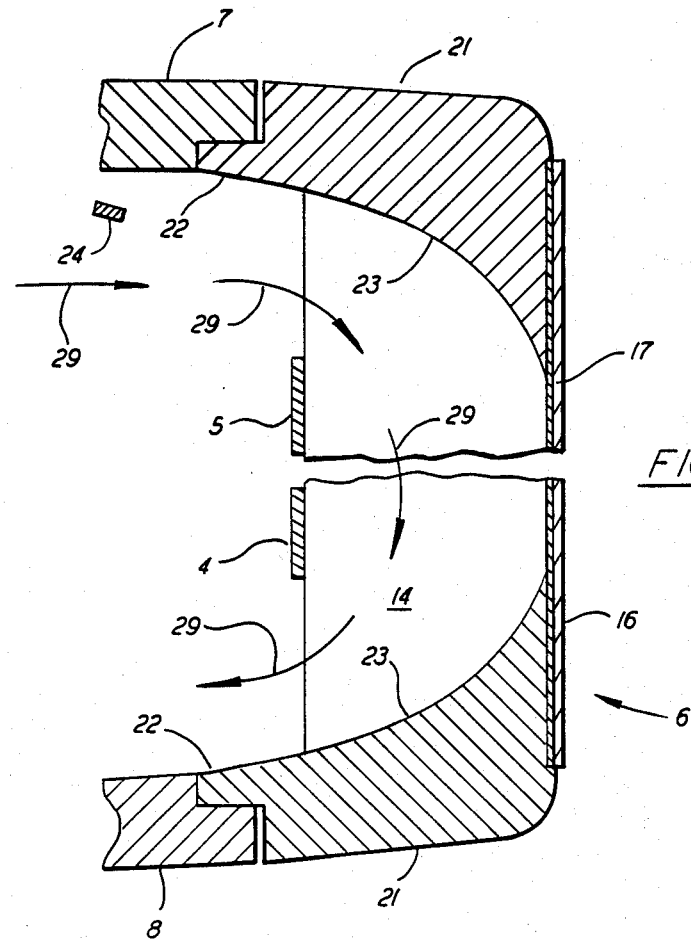
FIG. 5 is a cross-section taken vertically through the center of an inner groove of the heat exchange element shown in a portion of an associated electronic assembly enclosure.

With reference to FIGS. 4 and 5 details of the heat exchange element as previously described with reference to FIGS. 1, 2 and 3 may be more clearly seen. Reference numerals used in these figures are the same as those used in reference to FIGS. 1 and 2. The arrow 29 in FIGS. 2 and 5 illustrate the direction of air movement during a portion of the recirculation of the air by the blower 13. The inner grooves 18 define elongate openings 30 while the outer grooves 19 define elongate openings 31.

While the electronic assemblies to be cooled are described as being mounted vertically, it will be appreciated that other orientations may be used and that appropriate baffles or deflectors may be used to produce desired air flow patterns.

We claim:

1. A heat exchange element having a heat receiving side and a heat dissipating side and comprising a serpentine member defining a first plurality of parallel elongate grooves, having elongate openings all in the heat receiving side, and a second plurality of parallel elongate grooves, having elongate openings all in the heat dissipating side, the grooves of the first plurality being interdigitated with the grooves of the second plurality, the groove ends all terminating in open ends, and closure means closing all of the open ends of only one of the first and second plurality of grooves, said closure means being molded and cured in situ in the groove ends they close.

2. A heat exchange element according to claim 1 wherein the grooves have a generally rectangular cross-section normal to their length.

3. A heat exchange element according to claim 2 wherein the cross-section of the first plurality of grooves differs in area from the cross-section of the second plurality of grooves.

4. A heat exchange element according to claim 2 wherein the ratio of groove depth to groove width of the grooves exceeds approximately 3:1.

5. A heat exchange element according to claim 4 wherein the ratio of groove depth to groove width is approximately 8:1.

6. A heat exchange element according to claim 1 wherein the serpentine member is constructed of metal and the groove end closure means are constructed of a plastic material molded and cured in the groove ends they close.

7. A heat exchange element according to claim 6 wherein integrally formed with each closure means is an air flow director extending into the associated groove.

8. A heat exchange element according to claim 7 wherein the flow director defines a concave curved surface to minimize impedence to air flow entering and leaving the associated groove.

9. A heat exchange element according to claim 8 wherein the closures are connected together by an elongate portion integrally formed with the closures and adapted to facilitate mounting of the element.

* * * * *